(12) United States Patent
Choi et al.

(10) Patent No.: US 7,999,247 B2
(45) Date of Patent: Aug. 16, 2011

(54) ELECTRODE HAVING A TRANSPARENT ELECTRODE LAYER, ELECTRONIC DEVICE AND METHOD FOR MANUFACTURING THE SAME

(75) Inventors: Junhee Choi, Seongnam-si (KR); Andrei Zoulkarneev, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 266 days.

(21) Appl. No.: 12/068,581

(22) Filed: Feb. 8, 2008

(65) Prior Publication Data

US 2008/0297046 A1    Dec. 4, 2008

(30) Foreign Application Priority Data

May 30, 2007 (KR) .......................... 10-2007-0052802

(51) Int. Cl.
*H01L 29/02* (2006.01)

(52) U.S. Cl. ............... 257/3; 257/E51.01; 257/E21.575; 313/506; 438/652; 977/742

(58) Field of Classification Search ................. 257/3, 79, 257/E51.04, E21.575; 438/652; 313/506; 977/742
See application file for complete search history.

(56) References Cited

U.S. PATENT DOCUMENTS

| 7,012,362 | B2 | 3/2006 | Kawate et al. | |
| 2001/0007783 | A1* | 7/2001 | Lee et al. | 438/154 |
| 2004/0164327 | A1* | 8/2004 | Shin et al. | 257/208 |
| 2005/0186699 | A1* | 8/2005 | Kawase et al. | 438/99 |
| 2007/0215841 | A1* | 9/2007 | Ford et al. | 252/503 |

FOREIGN PATENT DOCUMENTS

| JP | 2003-059832 | 2/2003 |
| JP | 2006-339110 | 12/2006 |
| KR | 10-2002-0031817 | 5/2002 |
| KR | 10-2002-0037409 | 5/2002 |
| KR | 10-2002-0043952 | 6/2002 |
| KR | 10-2003-0081665 | 10/2003 |

* cited by examiner

*Primary Examiner* — Jami M Valentine
(74) *Attorney, Agent, or Firm* — Harness, Dickey & Pierce, P.L.C.

(57) ABSTRACT

Disclosed is an electrode having a transparent electrode layer, an opaque electrode layer formed on the transparent electrode layer and catalyst formed on an open surface on the transparent electrode layer, which open surface is not covered by the opaque electrode layer.

7 Claims, 19 Drawing Sheets

ELECTRODE HAVING A TRANSPARENT ELECTRODE LAYER, ELECTRONIC DEVICE AND METHOD FOR MANUFACTURING THE SAME

BACKGROUND OF THE INVENTION

1. Field of the Invention

The present invention relates to an electrode, an electronic device and methods for manufacturing the electrode and the electronic device.

2. Description of the Related Art

A carbon nano tube (CNT) has good mechanical and chemical properties as well as good electric conductivity and can be formed to have a diameter ranging from several or scores of nanometers to micrometers.

Accordingly, CNT is suitable for being applied to electronic devices such as transistor and inter-connector between electrodes. Further, CNT can be also applied to an optical switch used in a field of optical communication, a bio device, etc. as well as the electronic devices.

CNT is typically prepared by vertical or horizontal growing using an arc discharge method, a laser ablation method, a chemical vapor deposition using catalyst, a screen printing method, a spin coating method, etc.

For growing CNT horizontally without vertical growth, catalyst, from which CNT can grow, is required to be formed around side part of electrode.

SUMMARY OF THE INVENTION

There is provided an electrode comprising: a transparent electrode layer; an opaque electrode layer formed on the transparent electrode layer; and catalyst formed on an open surface on the transparent electrode layer, which open surface is not covered by the opaque electrode layer.

There is provided a method for manufacturing an electrode comprising steps of: a first step of forming an opaque electrode layer on a transparent electrode layer; a second step of forming an open surface on the transparent electrode layer, which open surface is not covered by the opaque electrode layer; a third step of forming a photoresist layer on the open surface of the transparent electrode layer and on the opaque electrode layer and carrying out an exposure to light through a rear surface of the electrode and development; a fourth step of forming catalyst on the open surface of the transparent electrode layer and on the photoresist on the opaque electrode layer; and a fifth step of lifting off the photoresist layer having the catalyst formed thereon.

There is provided an electronic device comprising: a substrate; and an electrode provided on the substrate, wherein the electrode comprises a transparent electrode layer, an opaque electrode layer formed on the transparent electrode layer and catalyst formed on an open surface of the transparent electrode layer, which open surface is not covered by the opaque electrode layer.

There is provided a method for manufacturing an electronic device comprising steps of: a first step of forming a transparent electrode layer on a substrate or a sacrifice layer formed on the substrate and forming an opaque electrode layer on the transparent electrode layer; a second step of patterning the transparent electrode layer and the opaque electrode layer to form an open surface on the transparent electrode layer, which open surface is not covered by the opaque electrode layer and to form an open surface on the substrate or the sacrifice layer, which open surface is not covered by the transparent electrode layer; a third step of forming a photoresist layer on the open surface of the substrate or the sacrifice layer, on the open surface of the transparent electrode layer and on the opaque electrode layer and carrying out an exposure to light through a rear surface of the substrate and development; a fourth step of forming catalyst on a surface on which the photoresist layer is developed and on the photoresist layer that remains without being developed; and a fifth step of carrying out a process of lifting off the photoresist layer having the catalyst formed thereon.

BRIEF DESCRIPTION OF THE DRAWINGS

FIG. 1b is a schematic view showing that CNT is horizontally grown from catalyst of the electrode in FIG. 1a;

FIG. 3b is a schematic view showing that CNT is horizontally grown from catalyst of the electrode in FIG. 3a;

FIG. 4b is a schematic view showing that CNT is horizontally grown from catalyst of the electrode in FIG. 4a;

FIGS. 14b and 14c are sectional views respectively along the lines of C-C and D-D in FIG. 14a;

DETAILED DESCRIPTION OF THE INVENTION

Hereinafter, embodiments of the present invention will be described with reference to the accompanying drawings.

Figure 1A:
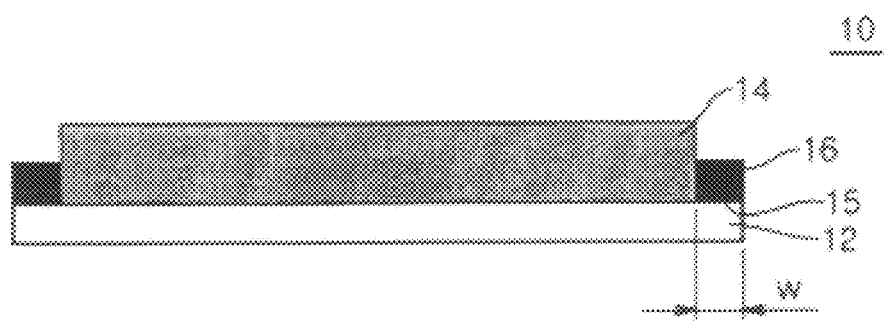
FIG. 1a is a sectional view of an electrode according to an embodiment of the invention.
Figure 1B:
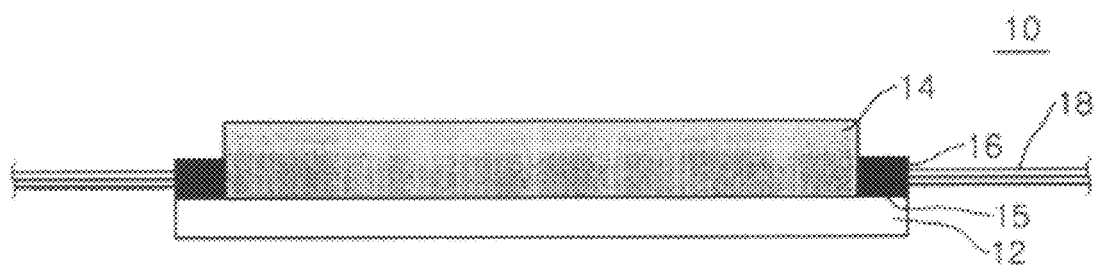

FIG. 1a is a sectional view of an electrode according to an embodiment of the invention and FIG. 1b is a schematic view showing that CNT is horizontally grown from catalyst of the electrode in FIG. 1a.

Referring to FIG. 1a, an electrode 10 consists of a transparent electrode layer 12 and an opaque electrode layer 14 formed on the transparent electrode layer 12. The opaque electrode layer 14 may cover most surfaces on the transparent electrode layer 12 except a surface from an outermost point on the transparent electrode layer 12 to an inner point of the transparent electrode layer 12. To this end, an open surface 15 is formed and catalyst 16 can be formed on the open surface 15. A width W of the open surface 15 can be two to three times larger than a thickness of the opaque electrode layer 14. When the width exceeds three times of the thickness of the opaque electrode layer 14, it can be difficult to control a horizontal growth of CNT.

As a material for the transparent electrode layer 12, an indium tin oxide (ITO) or a thin metal having a thickness of 50 nm or less and being typically used as an electrode may be used.

As a material for the opaque electrode layer 14, a thick metal having a thickness larger than 50 nm and being typically used as an electrode may be used.

As the catalyst, one or more selected from Iron (Fe), nickel (Ni), Invar, etc. may be used.

In the above electrode structure, the catalyst can be formed in a degree of several nm at a specific location on an electrode, in particular on a minute horizontal surface adjacent to a side part of the electrode.

Referring to FIG. 1b, CNT 18 is horizontally grown from the catalyst 16, which can be located on the minute horizontal surface adjacent to the side part of the electrode 10. When an electric field is applied, CNT 18 may be grown only in one direction along the electric field direction.

In the structure of the electrode 10, the opaque electrode 14 beside the catalyst 18 can make the electric field applied in order for CNT 18 to be grown only in one direction and also serve as a physical mask.

CNT 18 may be a single walled CNT (SWCNT) having superior electron mobility to that of multi-walled CNT or poly silicon.

Figure 2:
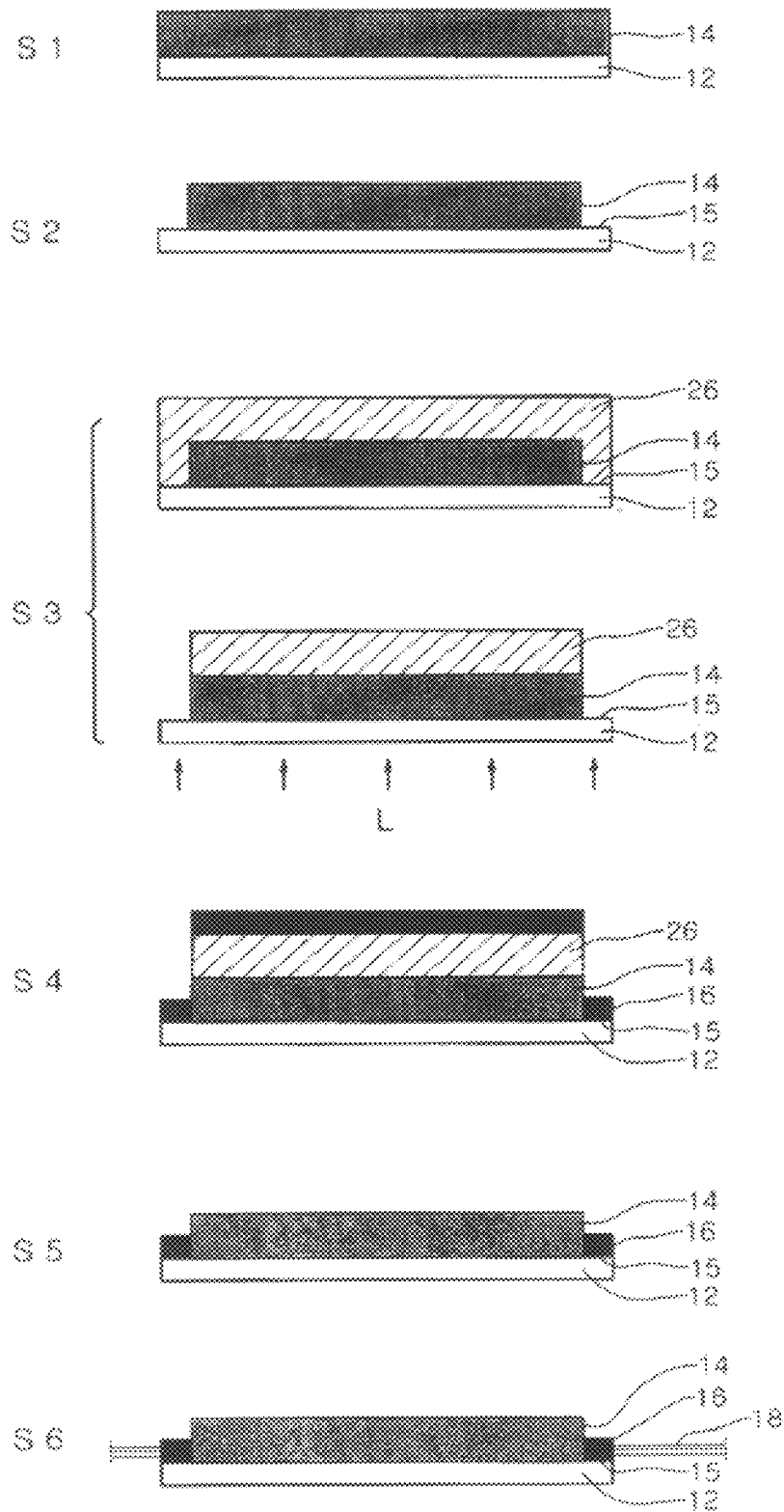
FIG. 2 is a sectional view showing a method for manufacturing an electrode in steps according to an embodiment of the invention.

FIG. 2 is a sectional view showing a method for manufacturing an electrode in steps according to an embodiment of the invention.

Referring to FIG. 2, in order to form the electrode 10, the opaque electrode layer 14 is in advance deposited on the transparent electrode layer 12 (S1).

Then, the opaque electrode layer 14 is patterned to form an open surface on the transparent electrode layer 12, which open surface is not covered by the opaque electrode layer 14.

The open surface can be formed from an outermost point on the transparent electrode layer 12 to an inner point on the transparent electrode layer 12 (S2).

Then, by coating a photoresist, a photoresist layer 26 is formed on the open surface 15 of the transparent electrode layer 12 and on the opaque electrode layer 14. Further, when the electrode is exposed to the ultraviolet L trough a rear surface of the transparent electrode layer 12, the ultraviolet L can transmit the transparent electrode layer 12 so that the photoresist layer 26 on the open surface 15 of the transparent electrode layer can be developed. To the contrary, the ultraviolet L cannot transmit the opaque electrode layer 14 so that the photoresist layer 26 on the opaque electrode layer 14 can not be developed (S3).

Then, the catalyst is deposited to be formed on the open surface 15 of the transparent electrode layer 12 and on the photoresist layer 26 on the opaque electrode layer 14 (S4). Herein, the catalyst can be thinly deposited by sputtering iron (Fe), nickel (Ni) or Invar or by using e-beam evaporation.

Then, when the photoresist layer 26 on the opaque electrode layer 14 is lifted off, the catalyst deposited on the photoresist layer 26 is also lifted off, so that only the catalyst formed on the open surface 15 of the transparent electrode layer 12 can remain (S5).

According to the described methods especially including the forming of the open surface on the transparent electrode layer, the exposure to light through a rear surface of the electrode and the lifting off the photoresist layer, the catalyst can be self-aligned around the side part of the electrode.

Then, when the electrode 10 is disposed in a chamber, the hydrocarbon gas containing carbon such as $C_2H_2$ or $CH_4$ or the like is introduced in the chamber and then DC or pulse voltage is applied to make an electric field, CNT comes to be horizontally grown from the catalyst 16 on the open surface 15 (S6).

Figure 3A:
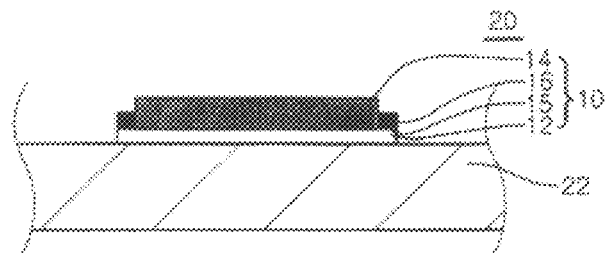
FIG. 3a is a sectional view of an electronic device according to a first embodiment of the invention.
Figure 3B:
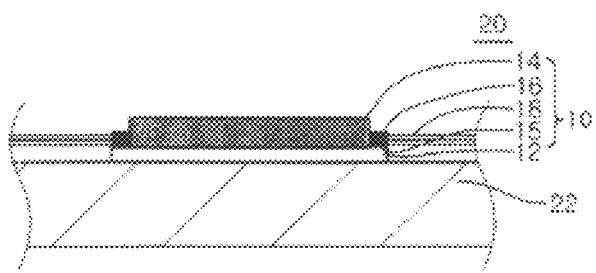

FIG. 3a is a sectional view of an electronic device according to a first embodiment of the invention, and FIG. 3b is a schematic view showing that CNT is horizontally grown from catalyst of the electrode in FIG. 3a.

Referring to FIGS. 3a and 3b, an electronic device 20 according to a first embodiment comprises at least the electrode 10 and a substrate 22 below the electrode.

The structure of the electrode 10 and CNT 18, which is horizontally grown from the catalyst 16 adjacent to the side part of the electrode 10 are the same as described above with reference to FIGS. 1a and 1b. The substrate 22 may be made of silicon or glass, for example.

Figure 4A:
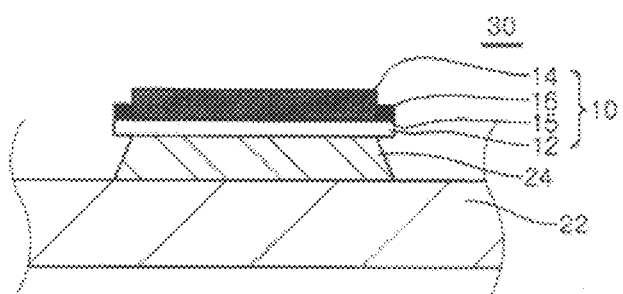
FIG. 4a is a sectional view of an electronic device according to a second embodiment of the invention.
Figure 4B:
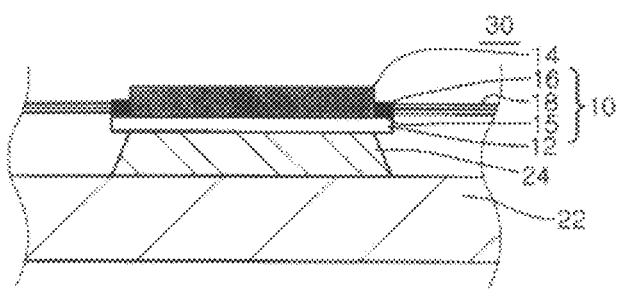

FIG. 4a is a sectional view of an electronic device according to a second embodiment of the invention and FIG. 4b is a schematic view showing that CNT is horizontally grown from catalyst of the electrode in FIG. 4a.

Referring to FIGS. 4a and 4b, an electronic device 30 according to a second embodiment is mostly the same as the electronic device 20 according to the first embodiment. However, in the electronic device 30 according to a second embodiment, a sacrifice layer 24 is further provided between the substrate 22 and the transparent electrode layer 12.

The sacrifice layer 24 can be made of silicon oxide, for example. When the sacrifice layer 24 is made of silicon oxide, the sacrifice layer 24 can serve as an insulating layer. The sacrifice layer 24 will be described more in detail hereinafter.

Figure 5A:
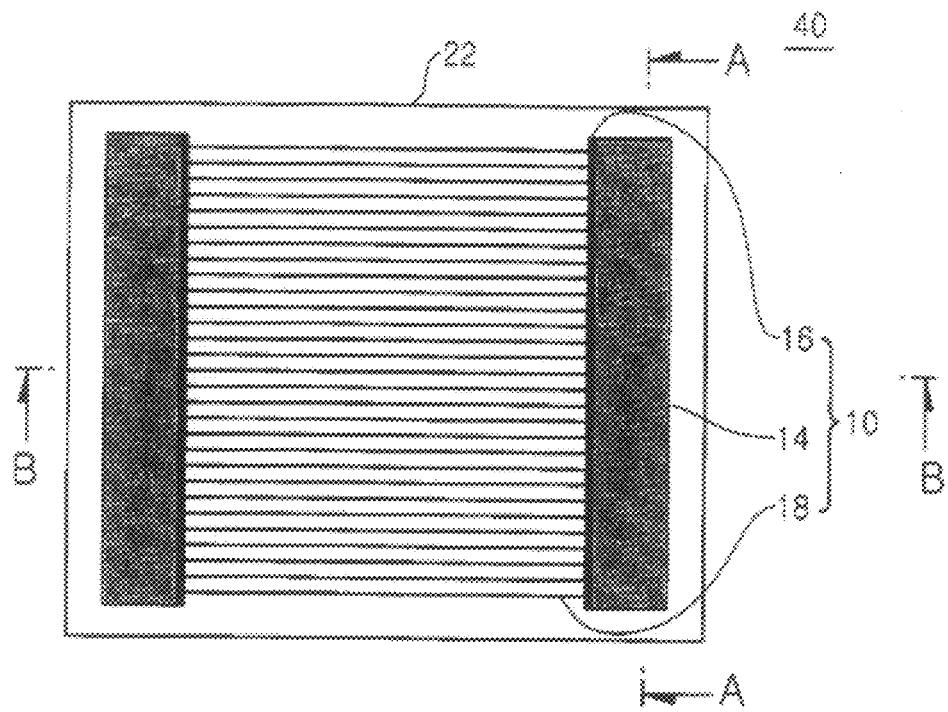
FIG. 5a is a plane view of an electronic device according to a third embodiment of the invention.

FIG. 5a is a plane view of an electronic device according to a third embodiment of the invention and FIGS. 5b~5d and 5e~5g are sectional views respectively along the lines of A-A and B-B in FIG. 5a, in which FIGS. 5b~5d and 5e~5g respectively show three different alternatives. FIG. 5h illustrates an equipotential line of an electric field when applying a voltage to each electrode of an electronic device according to a third embodiment of the invention.

Referring to FIG. 5a, an electronic device 40 according to a third embodiment comprises two electrodes 10 which are respectively a first electrode and a second electrode, and are formed to be parallel to each other on the substrate 22. Further, CNT 18 that is horizontally grown from the catalyst 16 of the one electrode 10 is connected to the other opposite electrode 10.

Referring to FIGS. 5a~5h, in the electronic device 40 according to a third embodiment, the transparent electrode layers 12 and the opaque electrode layers 14 of the electrodes 10 serve as a heating element. When a voltage is applied to both ends of the electrodes 10, the transparent electrode layers 12 and the opaque electrode layers 14 of the electrodes 10 generate Joule's heat which heats the catalyst 16.

A separating space S is present under the heating elements 12, 14 which respectively consist of the transparent electrode layer 12 and the opaque electrode layer 14. The space S separates the heating elements 12, 14 from a member below the heating elements 12, 14. Thus, the heating elements 12, 14 come to have a bridge shape on the separating space S. The separating space S prevents the heat, which is generated when current is applied, from being transferred to the member below the heating elements 12, 14, thereby forming a local heating area.

Figure 5B:
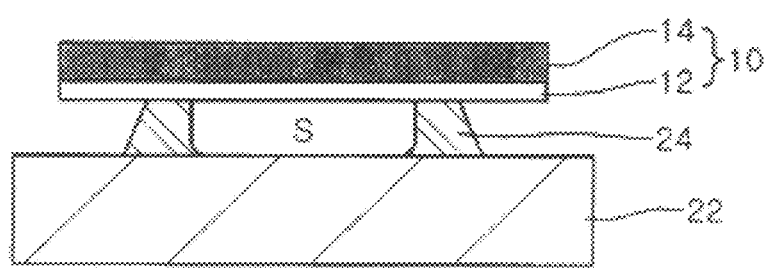
FIGS. 5b~5d and 5e~5g are sectional views respectively along the lines of A-A and B-B in FIG. 5a, in which FIGS. 5b~5d and 5e~5g respectively show three different alternatives.
Figure 5C:
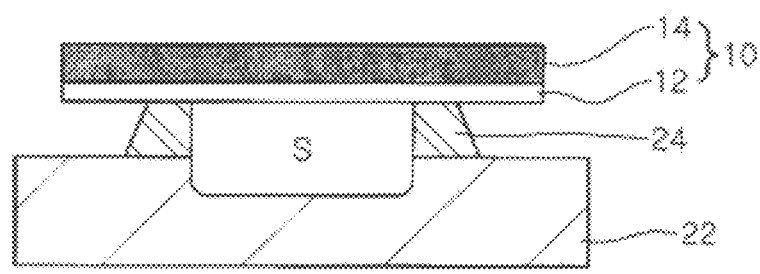
Figure 5D:
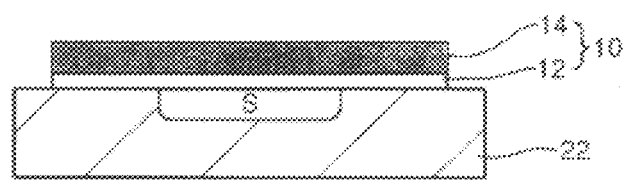
Figure 5E:
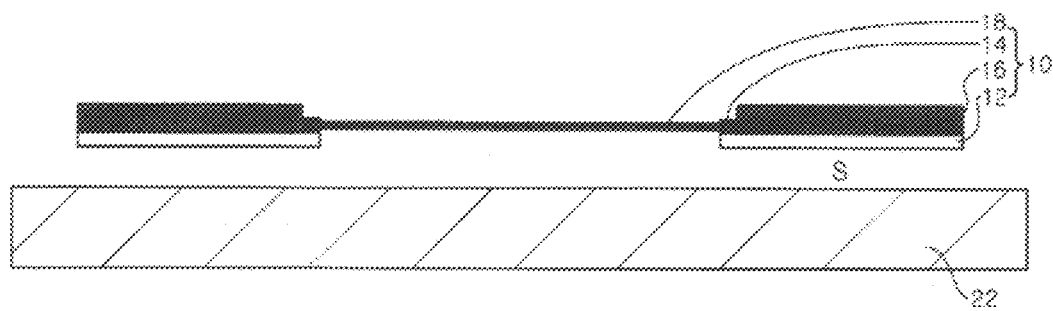

Referring to FIGS. 5b and 5e, when the sacrifice layer 24 is formed under the heating elements 12, 14, a part of the sacrifice layer 24 is etched, so that the separating space S is formed.

Figure 5F:
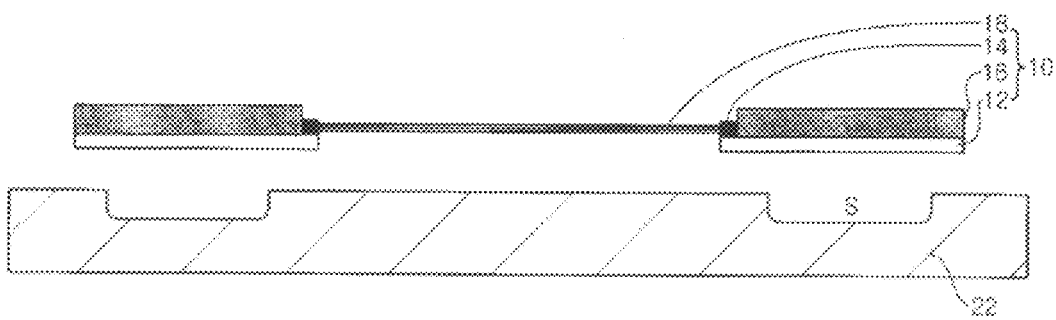

Referring to FIGS. 5c and 5f, when the sacrifice layer 24 is formed under the heating elements 12, 14, a part of the substrate 22 as well as a part of the sacrifice layer 24 are etched, if necessary, so that the separating space S is formed.

Figure 5G:
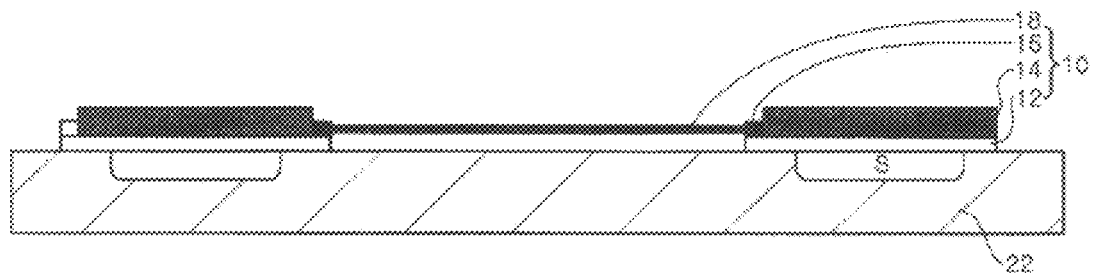
Figure 5H:
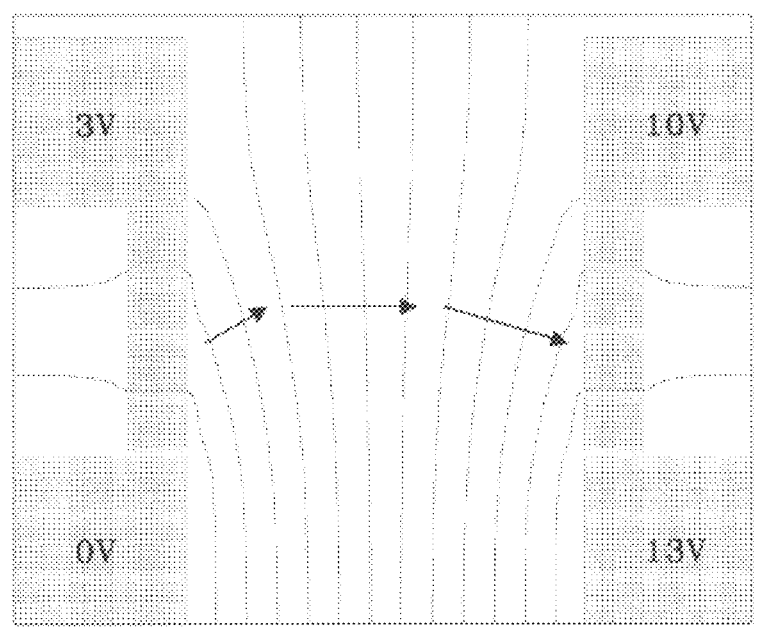
FIG. 5h illustrates an equipotential line of an electric field when applying a voltage to each electrode of an electronic device according to a third embodiment of the invention.

Referring to FIGS. 5d and 5g, when a separate sacrifice layer is not formed below the heating elements 12, 14, the substrate 22 is etched, so that the separating space S is formed.

Referring to FIG. 5a again, the heating elements 12, 14, which are heated to predetermined temperatures, for example 900~1000° C. on the substrate, make CNT be grown from the catalyst, which is formed adjacent to side parts of the heating elements 12, 14, horizontally with the carbon containing gas. The CNT that has been horizontally grown is connected to the opposite electrode 10.

Referring to FIG. 5h, when a predetermined DC or pulse voltage is applied to both ends of the respective electrodes 10, a direction of the electric field is a vertical direction (arrow direction in FIG. 5h) between two equipotential lines. CNT is grown in a predetermined direction along the electric field. The first and second electrodes 10 are spaced each other by approximately 13 μm, and an intensity of the electric field between the first and second electrodes 10 is approximately 1V/μm.

Figure 6:
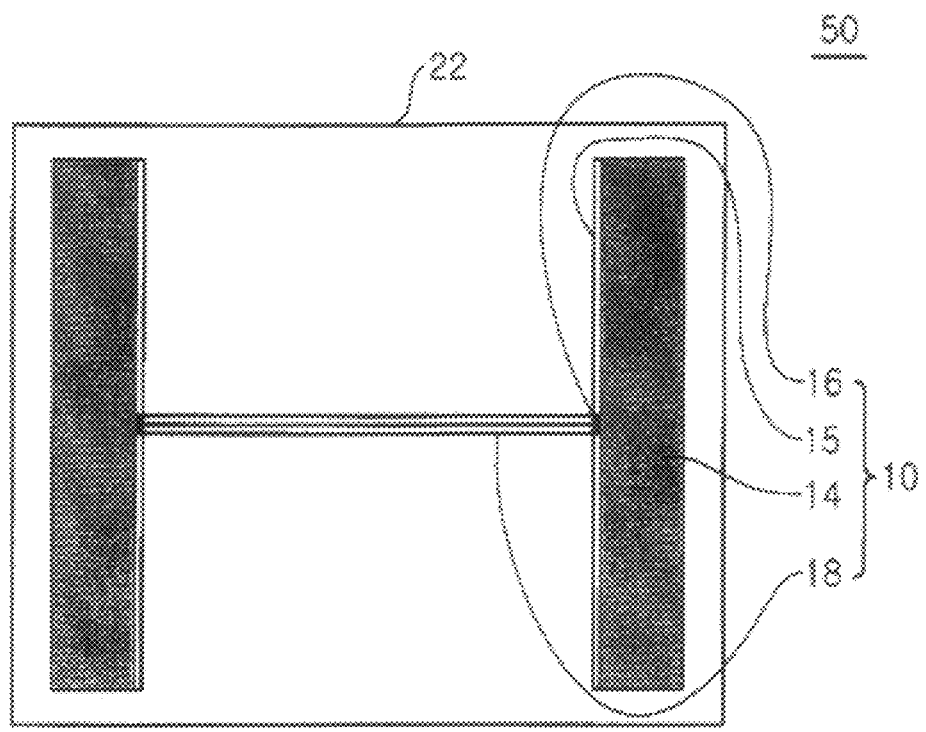
FIG. 6 is a plane view of an electronic device according to a fourth embodiment of the invention.

FIG. 6 is a plane view of an electronic device according to a fourth embodiment of the invention.

Referring to FIG. 6, an electronic device 50 according to a fourth embodiment has a structure that is mostly the same as the electronic device 40 according to the third embodiment. However, in case of the electronic device 50 according to a fourth embodiment, the catalyst 16 of the electrode 10 is controlled to be formed on a part of the open surface 15. Therefore, CNT 18 is horizontally grown from the catalyst 16 that is formed on the part of the open surface 15. The control of the formation location of the catalyst 16 will be described more in detain hereinafter.

Figure 7:
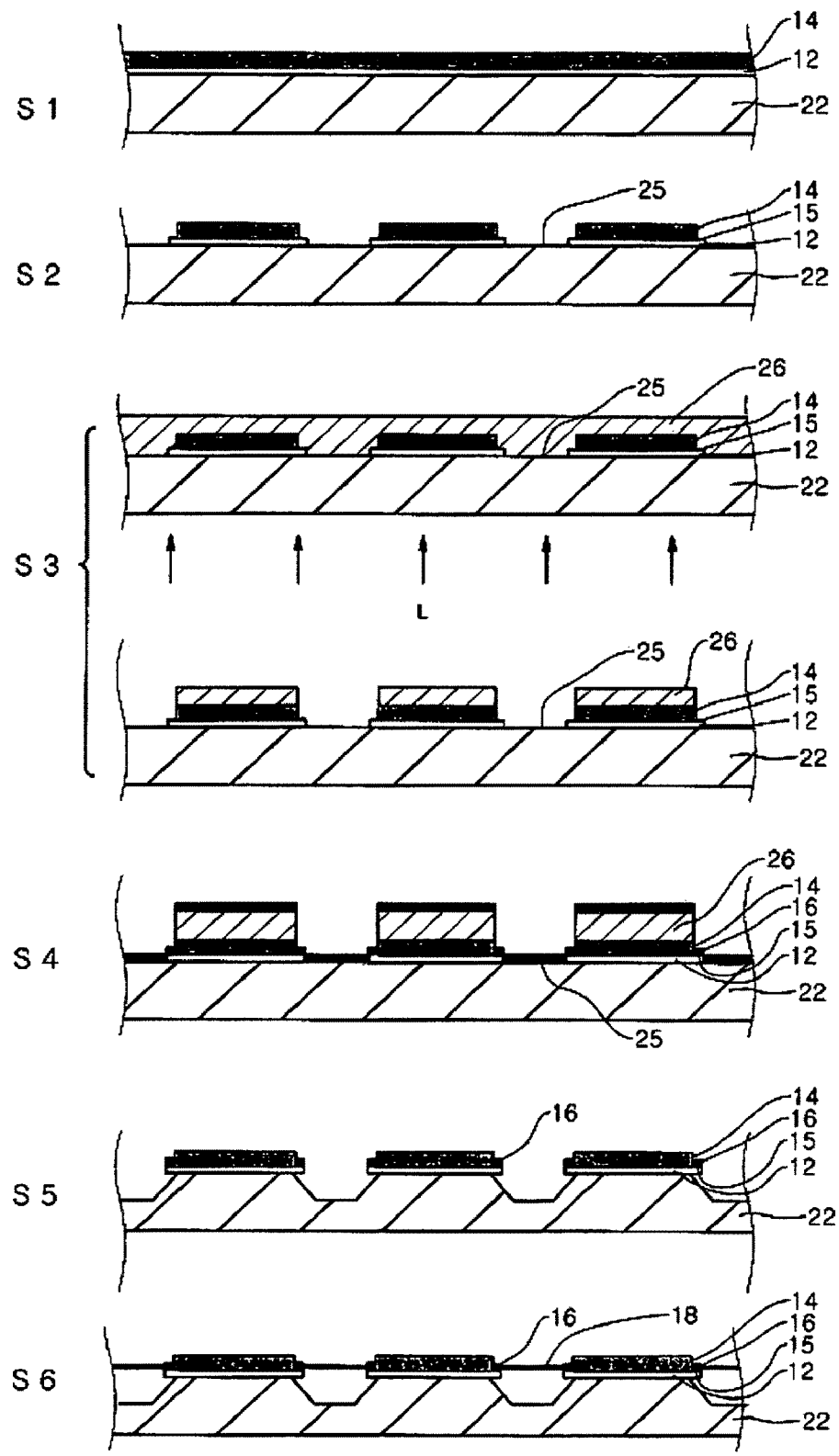
FIG. 7 is a sectional view showing a method for manufacturing an electronic device in steps according to a first embodiment of the invention.

FIG. 7 is a sectional view showing a method for manufacturing an electronic device in steps according to a first embodiment of the invention.

Referring to FIG. 7, a transparent electrode layer 12 is deposited on a substrate 22 in advance, and an opaque electrode layer 14 is deposited on the transparent electrode layer 12.

Then, the opaque electrode layer 14 is patterned up to a part spaced at a distance from an outermost point on the transparent electrode layer 12, thereby forming an open surface 15 on the transparent electrode layer 12, which open surface is not covered by the opaque electrode layer 14. In addition, a part of the transparent electrode layer 12 on the substrate 22 is patterned to form an open surface 25 on the substrate 22, which open surface is not covered by the transparent electrode layer 12 (S2). Herein, for example, the transparent electrode layer 12 is anisotropically etched and the opaque electrode layer 14 is isotropically etched.

Then, by coating a photoresist, a photoresist layer 26 is formed on the open surface 15 of the transparent electrode layer, on the open surface 25 of the substrate and on the opaque electrode layer 14. After that, when the exposure to the ultraviolet L is carried out trough a rear surface of the substrate 22, the ultraviolet L can transmit the substrate 22 and the transparent electrode layer 12, so that the photoresist layer 26 on the open surface 15 of the transparent electrode layer and the open surface 25 of the substrate can be developed. To the contrary, the ultraviolet L cannot transmit the opaque electrode layer 14, so that the photoresist layer 26 on the opaque electrode layer 14 can not be developed (S3).

Then, by depositing a catalyst, the catalyst is formed on the open surface 15 of the transparent electrode layer, on the open surface 25 of the substrate and on the opaque electrode layer 14 (S4).

Then, by lifting off the photoresist layer 26 on the opaque electrode layer 14 using a photoresist etching solution, the catalyst on the photoresist layer 26 is also lifted off together.

In addition, in order to remove the catalyst on the open surface 25 of the substrate, a circumference of the substrate having the catalyst thereon can be etched and lifted off.

The formed catalyst 16 may be very thin, for example 10 nm or less, typically, and the etching solution of the substrate 22 or the photoresist etching solution transmits the catalyst 16. In addition, the etching solution of the substrate 22 has selectivity for the photoresist layer 26 as well as the transparent metal layer 12 and the opaque metal layer 14.

In the above process, the sequence of lifting off the photoresist layer 26 and lifting off the substrate 22 can be changed.

As the photoresist layer 26 and the substrate 22 are lifted off, only the catalyst that is deposited on the open surface 15 of the transparent electrode layer remains (S5).

Then, when the electrode 10 is disposed in a chamber, hydrocarbon gas containing carbon is introduced in the chamber, and then DC or pulse voltage is applied to provide an electric field. To this end, CNT is horizontally grown from the catalyst 16 that is deposited on the open surface 15 (S6).

As described above, the open surface is formed on the transparent electrode layer, the exposure to light through the rear surface of the electrode is carried out and lifting off the photoresist layer and the substrate (For reference, in a case shown in FIG. 9, the lifting off of a sacrifice layer) are carried out, so that the catalyst is self-aligned around the side part of the electrode.

Figure 8:
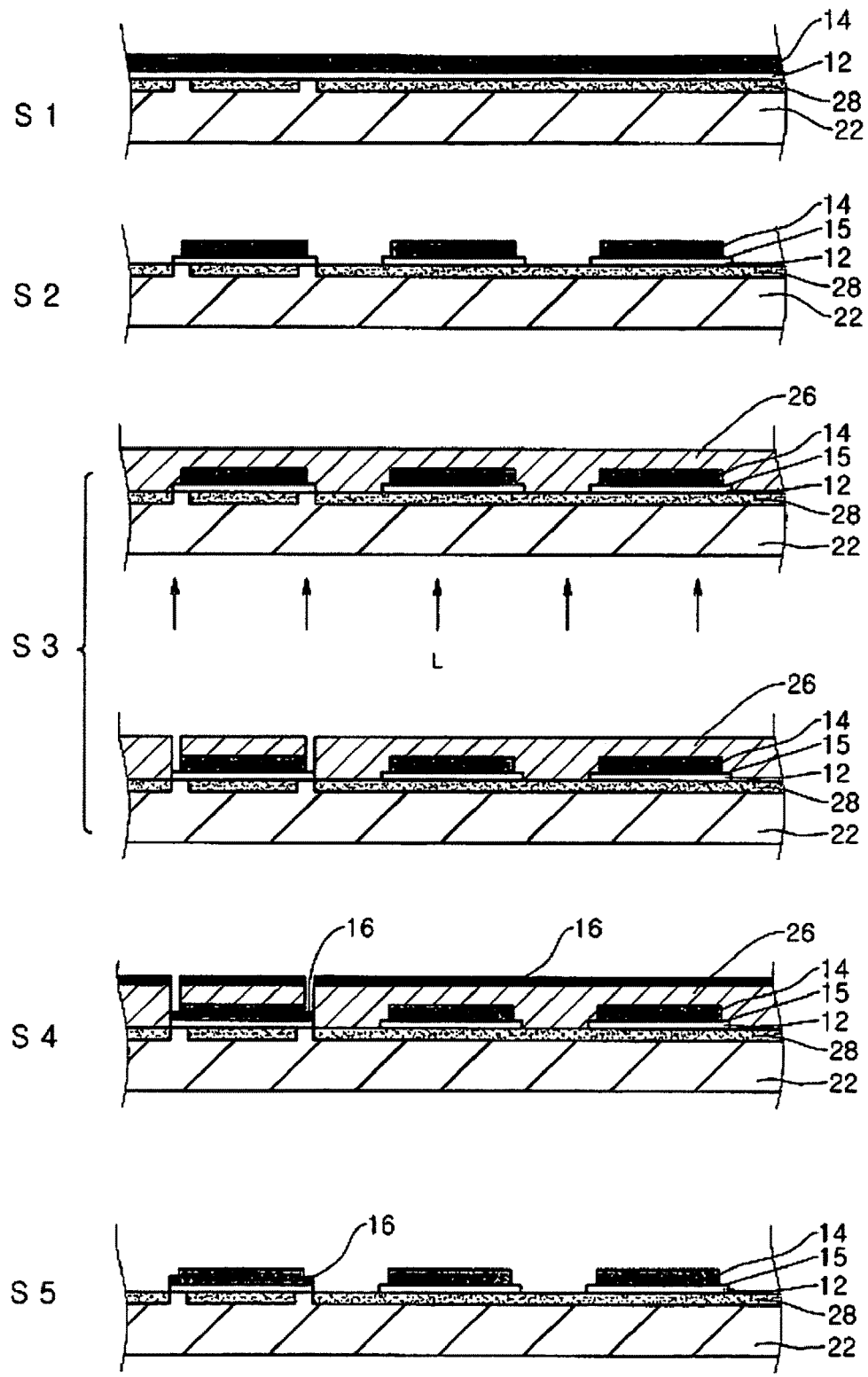
FIG. 8 is a sectional view illustrating a case where a selective exposure is carried out in a method for manufacturing an electronic device according to a first embodiment of the invention.

FIG. 8 is a sectional view illustrating a case where a selective exposure is carried out in a method for manufacturing an electronic device according to a first embodiment of the invention.

Referring to FIG. 8, an exposure blocking layer 28 is formed in advance at a part on the substrate 22 for which the exposure is not desired. Then, a transparent electrode layer 12 is deposited, and an opaque electrode layer 14 is deposited on the transparent electrode layer 12 (S1).

Then, a patterning is carried out (S2).

After that, a photoresist layer 26 is coated and the exposure to the ultraviolet L is carried out trough a rear surface of the substrate 22. The ultraviolet L can not transmit at a part in which the exposure blocking layer 28 is present and the ultraviolet L can transmit at a part in which the exposure blocking layer 28 is not present. As a result, FIG. 8 shows that the photoresist layer 26 is developed only at some part (S3).

Then, a catalyst 16 is deposited, thereby forming the catalyst on the open surface 15 of the transparent electrode layer and the remaining photoresist layer 26 (S4).

Then, the photoresist layer 26 is lifted off, and to this end the catalyst 16, which is deposited on the photoresist layer 26, is also lifted off together (S5).

Compared to the case shown in FIG. 7, the exposure blocking layer is interposed to carry out the selective exposure, so that the catalyst can be formed only on the open surface 15 of the transparent electrode layer without etching the substrate.

Figure 9:
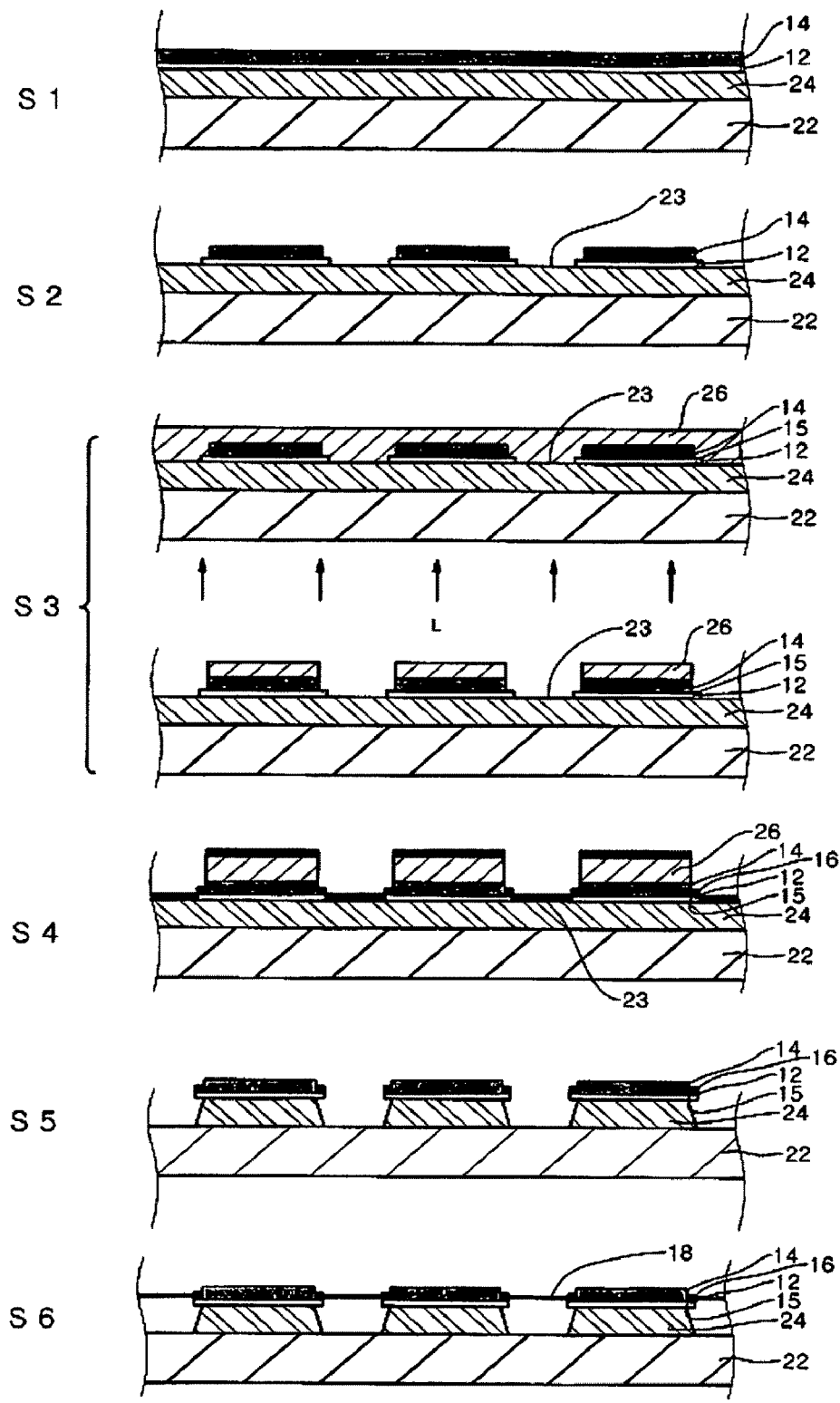
FIG. 9 is a sectional view showing a method for manufacturing an electronic device in steps according to a second embodiment of the invention.

FIG. 9 is a sectional view showing a method for manufacturing an electronic device in steps according to a second embodiment of the invention.

Referring to FIG. 9, a sacrifice layer 24 is formed in advance on a substrate, a transparent electrode layer 12 is formed on the sacrifice layer 24 and an opaque electrode layer 14 is formed on the transparent electrode layer 12 (S1). That is, in this method, a sacrifice layer 24 is further formed compared to the method according to the first embodiment. However, if the material of the substrate 22 is the same as that of the sacrifice layer 24, it is not necessary to form the sacrifice layer 24.

Then, the opaque electrode layer 14 can be patterned up to a part that is spaced at a distance from an outermost point on the transparent electrode layer 12 to form an open surface 15 on the transparent electrode layer 12, which open surface is not covered by the opaque electrode layer 14. In addition, a part of the transparent electrode layer 12 on the sacrifice layer 24 can be patterned to form an open surface 23 on the sacrifice layer 24, which open surface is not covered by the transparent electrode layer 12 (S2).

Then, by coating a photoresist, a photoresist layer 26 is formed on the open surface 15 of the transparent electrode layer, on the open surface 25 of the sacrifice layer and on the opaque electrode layer 14. After that, when the exposure to the ultraviolet L is carried out through a rear surface of the substrate 22, the ultraviolet L can transmit the substrate 22, the sacrifice layer 24 and the transparent electrode layer 12, so that the photoresist layer 26 on the open surface 15 of the transparent electrode layer and the open surface 25 of the sacrifice layer can be developed. To the contrary, the ultraviolet L cannot transmit the opaque electrode layer 14, so that the photoresist layer 26 on the opaque electrode layer 14 can not be developed (S3).

Then, by depositing a catalyst, the catalyst is formed on the photoresist layer 26 on the open surface 15 of the transparent electrode layer, on the open surface 23 of the sacrifice layer and on the opaque electrode layer 14 (S4).

Then, when the photoresist layer 26 on the opaque electrode layer 14 is lifted off using a photoresist etching solution, the catalyst that is deposited on the photoresist layer 26 is also lifted off together.

In addition, in order to remove the catalyst on the open surface 25 of the sacrifice layer, a circumference of the sacrifice layer 24 having the catalyst thereon can be etched and lifted off.

The catalyst 16 may be very thin, for example 10 nm typically and the etching solution of the sacrifice layer 24 or the photoresist etching solution transmits the catalyst 16.

In addition, the etching solution of the sacrifice layer 24 has selectivity for the the photoresist layer 26 as well as the transparent metal layer 12 and the opaque metal layer 14.

In the above process, the sequence of lifting off the photoresist layer 26 and lifting off the sacrifice layer 24 can be changed.

As the photoresist layer 26 and the sacrifice layer 24 are lifted off, the catalyst remains on the transparent electrode layer only (S5).

Then, when the electrode 10 is disposed in a chamber, hydrocarbon gas containing carbon is introduced in the chamber and then DC or pulse voltage is applied to provide an electric field. To this end, CNT is horizontally grown from the catalyst 16 that is deposited on the open surface 15 (S6).

Figure 10:
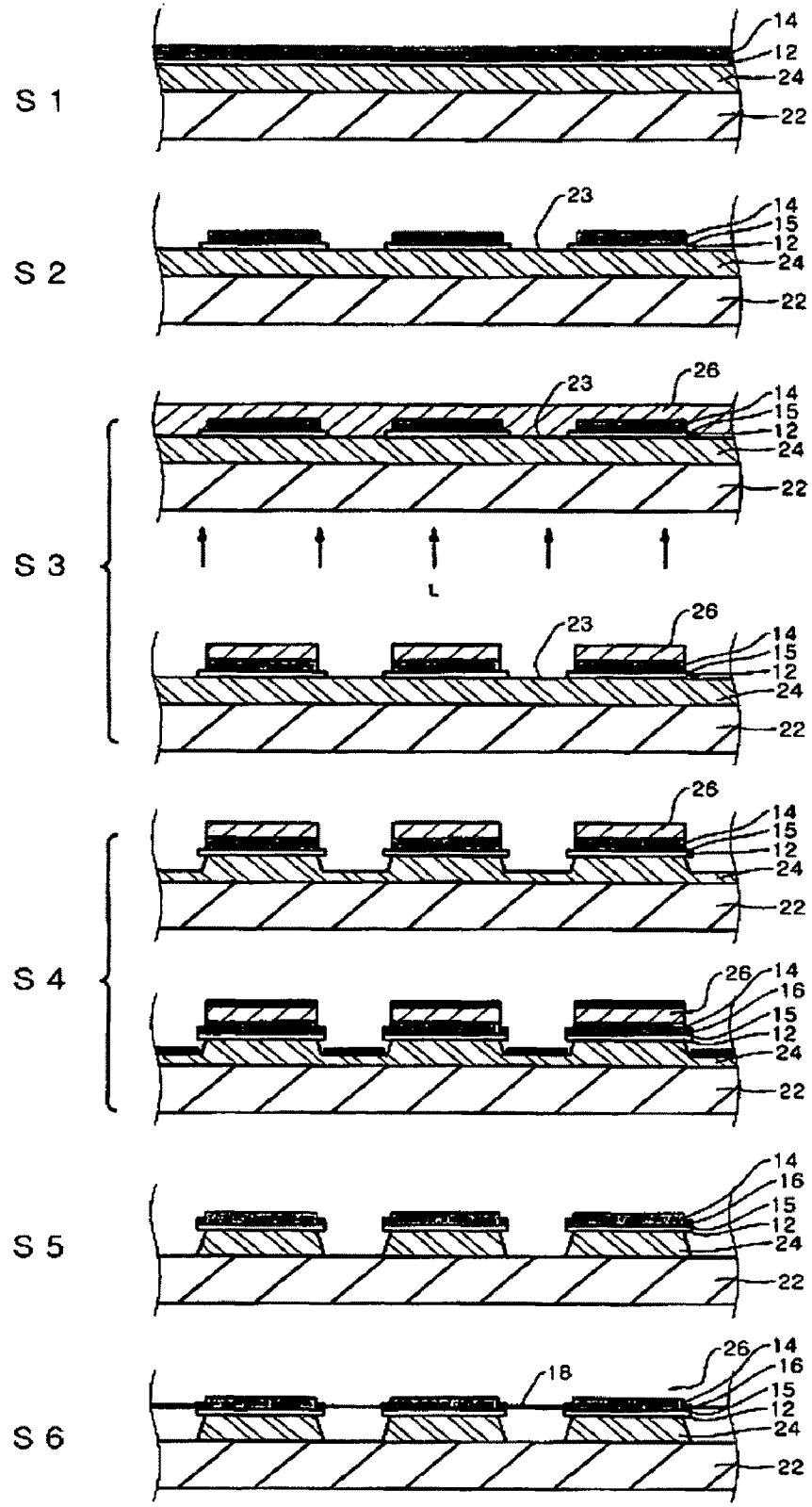
FIG. 10 is a sectional view showing an alternative of a method for manufacturing an electronic device according to a second embodiment of the invention in steps.

FIG. 10 is a sectional view showing an alternative of a method for manufacturing an electronic device according to a second embodiment of the invention in steps.

Referring to FIG. 10, the steps of S1 to S3 are the same as described with reference to FIG. 9 except that a part of the sacrifice layer 24 is partially lifted off in advance in the step of S4 before the catalyst is deposited.

Then, the catalyst is deposited, thereby forming the catalyst on the sacrifice layer 24 that is partially lifted off, on the open surface 15 of the transparent electrode layer and on the opaque electrode layer (S4).

Then, when the photoresist layer 26 on the opaque electrode layer 14 is lifted off, the catalyst, which is deposited on the photoresist layer 26, is also lifted off together. In addition, in order to remove the catalyst on the sacrifice layer 24 that is partially lifted off the partially lifted off sacrifice layer 24 is further lifted off. Thereby, the catalyst remains only on the open surface 15 of the transparent electrode layer (S5). Herein, the sequence of lifting off the photoresist layer 26 and further lifting off the partially lifted off sacrifice layer 24 can be changed.

Even when the sacrifice layer is formed as in the method according to the second embodiment, the catalyst formation location can be controlled through the selective exposure as in the method according to the first embodiment. Moreover, when the sacrifice layer is formed as in the method according to the second embodiment, an accuracy of alignment can be further reduced in case of carrying out the selective exposure, which will be described more in detail with reference to FIG. 11.

Figure 11:
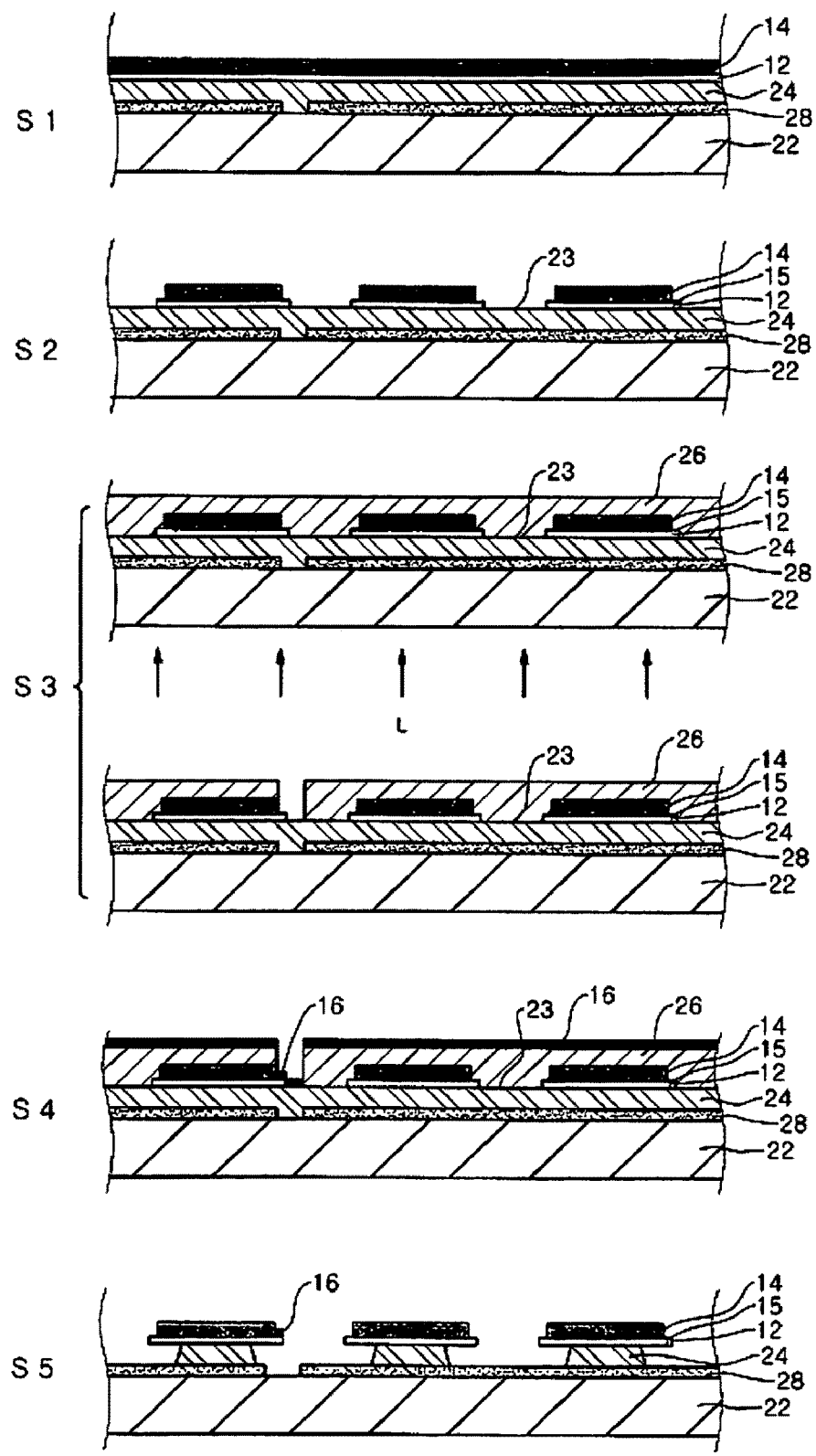
FIG. 11 is a sectional view illustrating a case where a selective exposure is carried out in a method for manufacturing an electronic device according to a second embodiment of the invention.

FIG. 11 is a sectional view illustrating a case where a selective exposure is carried out in a method for manufacturing an electronic device according to a second embodiment of the invention.

Referring to FIG. 11, an exposure blocking layer 28 is formed at a part on the substrate for which the selective exposure is not desired, and then a sacrifice layer 24 is formed. After that, a transparent electrode layer 12 and an electrode layer 14 are respectively formed and patterned (S1, S2).

Then, a photoresist layer 26 is coated and an exposure to ultraviolet L is carried out through a rear surface of the substrate 22. The ultraviolet L cannot transmit at a part in which the exposure blocking layer 28 is present and the ultraviolet L can transmit only at a part in which the exposure blocking layer 28 is not present, so that the photoresist layer 26 can be developed at some part. As shown in FIG. 11, even in case of carrying out the selective exposure at a desired location, an alignment of high accuracy is not required since there is nothing more to do for the alignment as long as the open part of the exposure blocking layer 28 just covers the part of the open surface of the transparent electrode layer, on which the catalyst is intended to be desirably formed. This fact means that even with the alignment of low accuracy, the catalyst formation can be controlled sufficiently and easily at a desired location (S3).

Then, the catalyst is deposited (S4), the photoresist layer 26 is lifted off and the sacrifice layer 24 is lifted off, thereby controlling the catalyst formation at a desired location on the open surface of the transparent electrode layer (S5).

Figure 12:
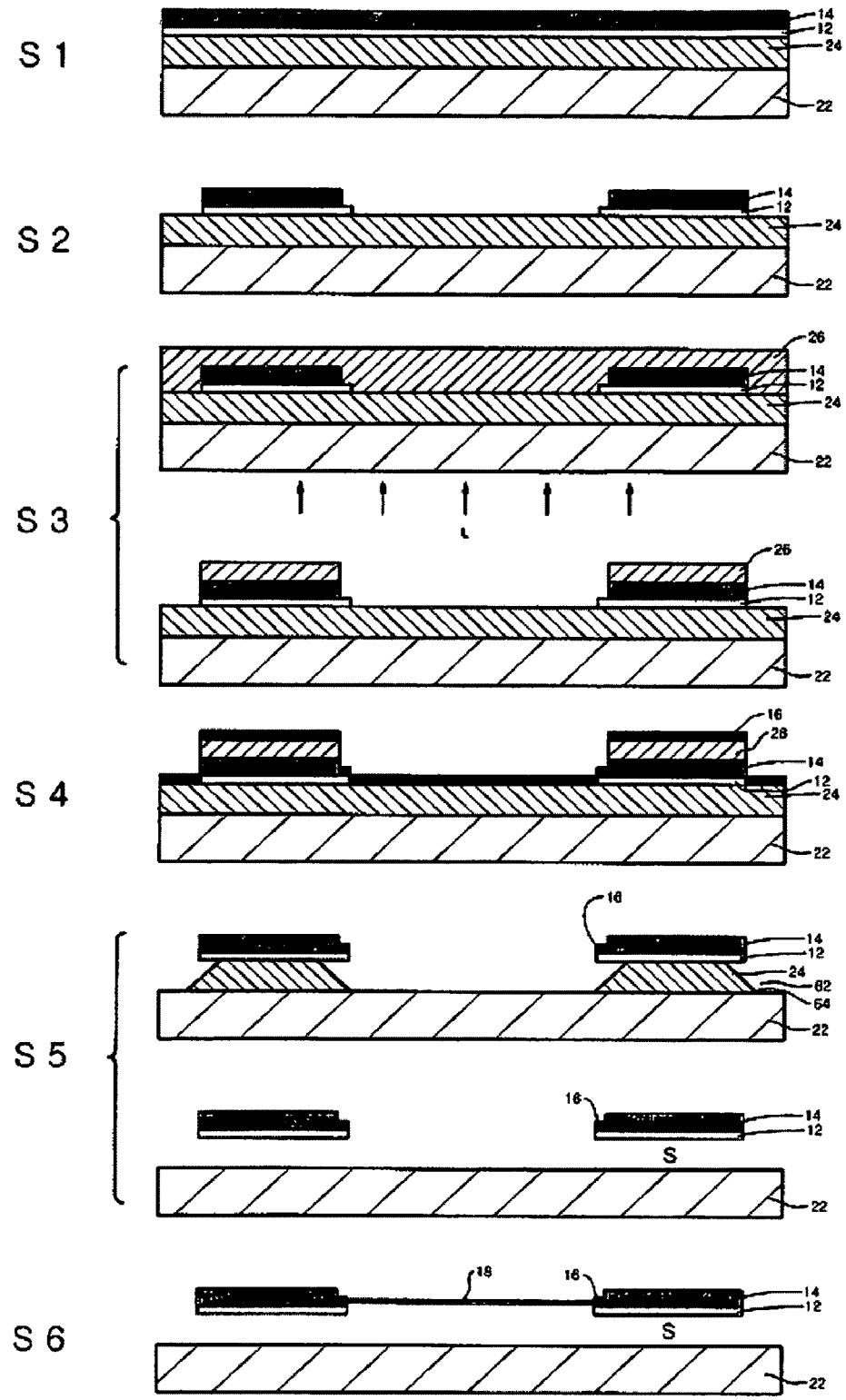
FIG. 12 is a sectional view showing a method for manufacturing an electronic device according to a third embodiment of the invention in steps, based on a line of B-B as shown in FIGS. 5e~5g.

FIG. 12 is a sectional view showing a method for manufacturing an electronic device according to a third embodiment of the invention in steps, based on a line of B-B as shown in FIGS. 5e~5g.

Referring to FIG. 12, the process is the same as described with reference to FIG. 9, except that in the step of S2, the two electrodes 10 are patterned so that they are opposite to each other and in the step of S5, the separating space S is formed under the transparent electrode layer 12 by etching. Though FIG. 12 shows that the separating space S is formed in the step of S5, it is not necessarily required to form the separating space S in the step of S5. The separating space S can be formed in any one of the steps of S1 to S5.

Figure 13:
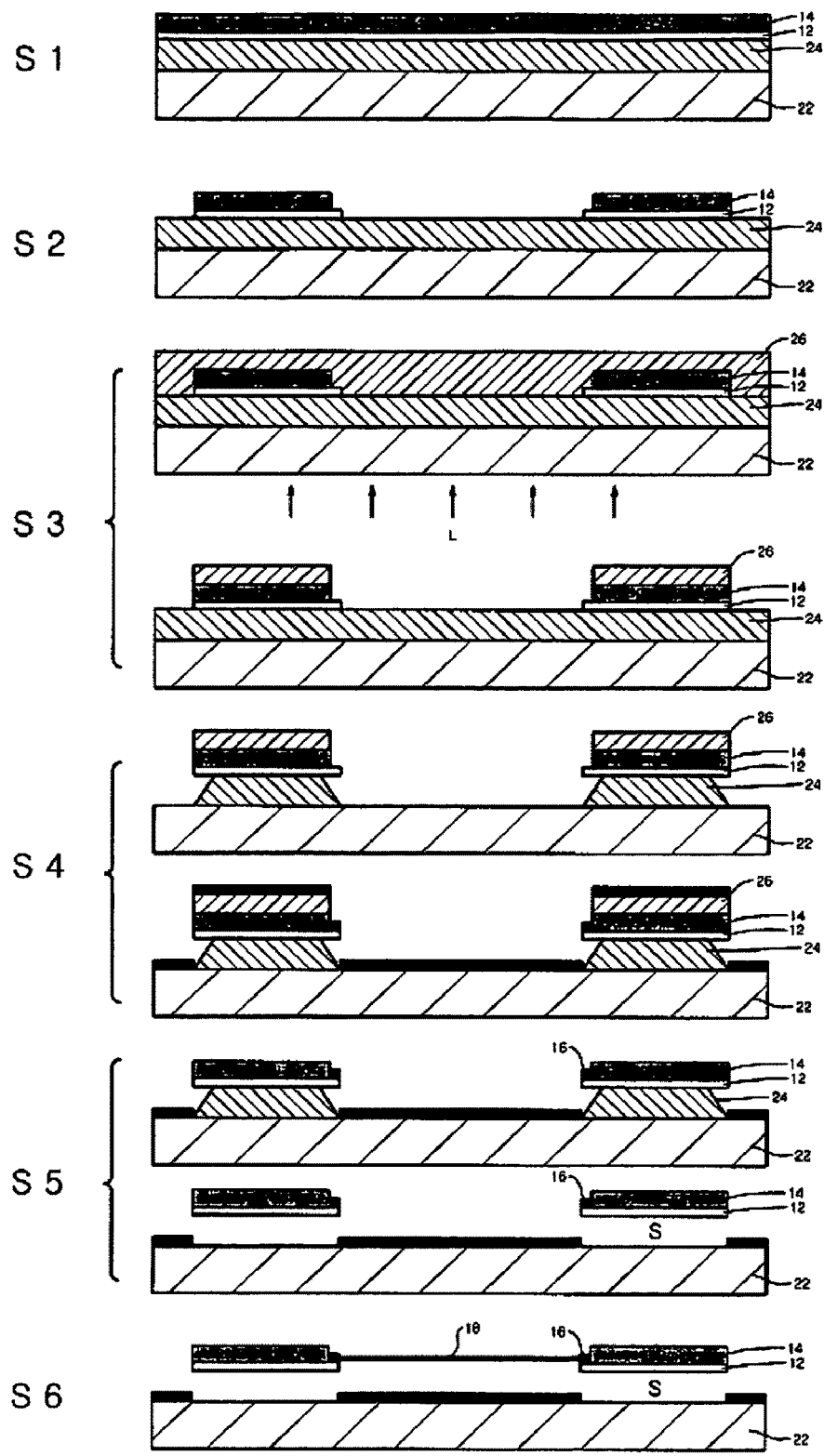
FIG. 13 is a sectional view showing an alternative of a method for manufacturing an electronic device according to a third embodiment of the invention in steps.

FIG. 13 is a sectional view showing an alternative of a method for manufacturing an electronic device according to a third embodiment of the invention in steps.

Referring to FIG. 13, the other steps are the same as those of FIG. 12, except that before forming the catalyst in the step of S4, a part of the sacrifice layer 24 is lifted off in advance and then the catalyst is formed. In the step of S5, only the photoresist layer 26 is lifted off without any lifting off the sacrifice layer. Since there is no sacrifice layer 24 to be lifted off in the step of S5, the process can be simplified. Though the catalyst is on the substrate in some part, there is no worry for CNT being grown from the catalyst in that part because there is no heating elements under the catalyst in the part, from which CNT can grow.

Figure 14A:
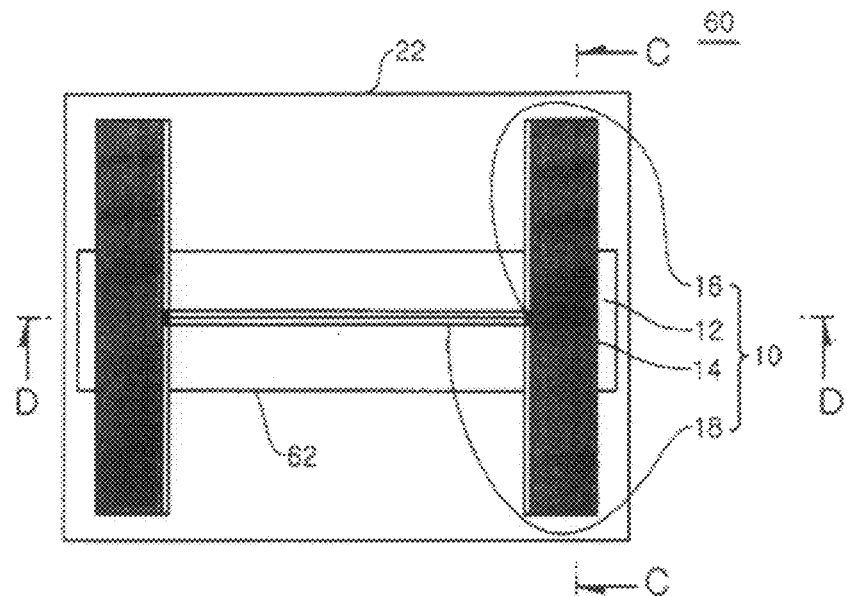
FIG. 14a is a plane view of a field effect transistor according to a first embodiment of the invention.
Figure 14B:
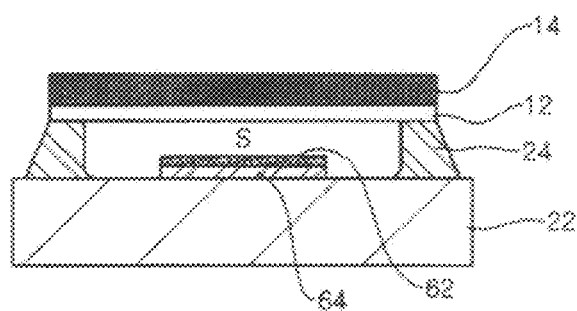
Figure 14C:
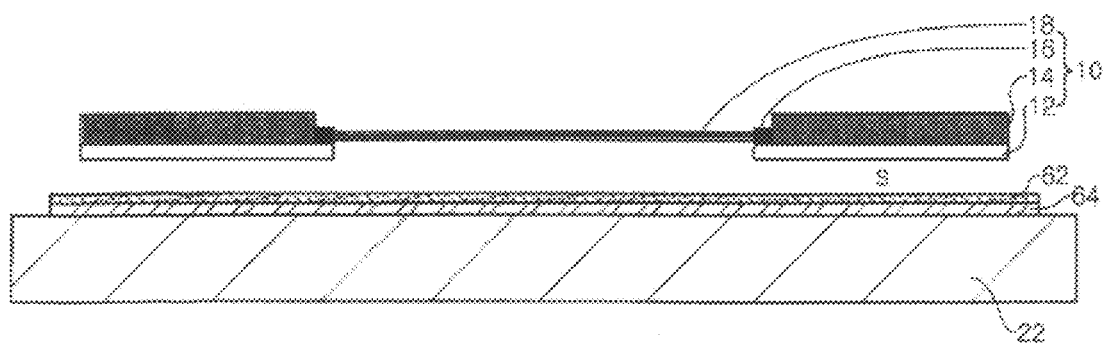

FIG. 14a is a plane view of a field effect transistor according to a first embodiment of the invention and FIGS. 14b and 14c are sectional views respectively along the lines of C-C and D-D in FIG. 14a.

Referring to FIG. 14a, a field effect transistor 60 has a gate electrode 62 formed on the substrate and first and second electrodes 10 that are formed in a line with each other and interpose the gate electrode therebetween. The first and second electrodes are a source electrode and a drain electrode, respectively. In addition, CNT 18 that is horizontally grown from the catalyst 16 of the electrode is connected to the opposite electrode 10.

Referring to FIGS. 14a, 14b and 14c, the gate electrode 62 is formed on a sacrifice layer 64, if necessary. The transparent electrode layers 12 and the opaque electrode layers 14 of the electrodes 10 serve as a heating element. When a voltage is applied to both ends of the electrodes 10, the transparent electrode layers 12 and the opaque electrode layers 14 of the electrodes 10 generate Joule's heat that heats the catalyst 16.

A separating space S is present under the heating elements 12, 14. The separating space S separates the heating elements 12, 14 from a member below the heating elements. Thus, the heating elements 12, 14 come to have a bridge shape on the separating space S. The separating space S prevents the heat, which is generated when current is applied, from being transferred to the member below the heating elements, thereby forming a local heating area.

As described above, when DC or pulse voltage is applied to both ends of the electrodes 10, CNT is grown along a direction of the electric field and an intensity of the electric field is approximately 1 V/μm.

Figure 15:
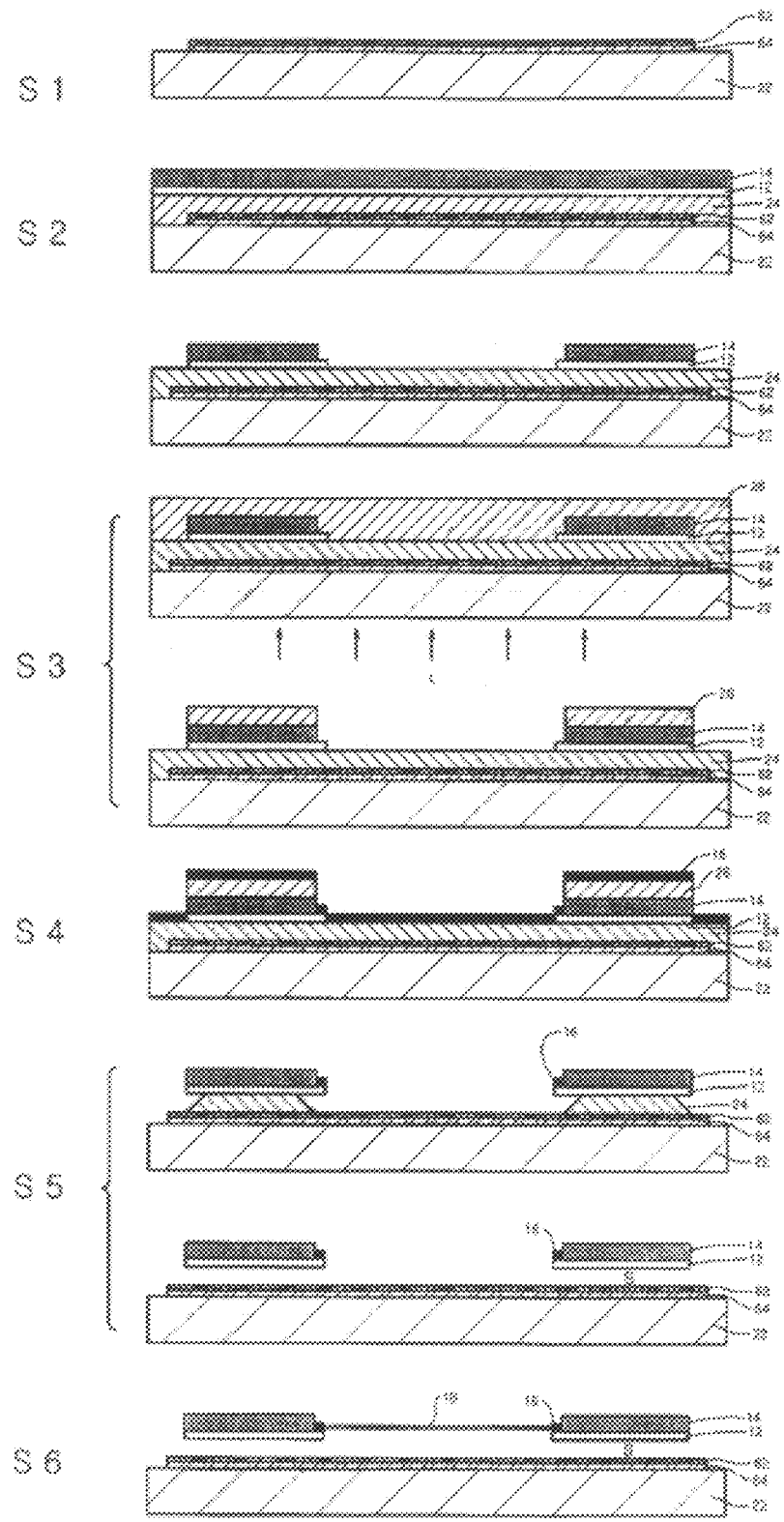
FIG. 15 is a sectional view showing a method for manufacturing a field effect transistor according to a first embodiment of the invention in steps, based on a line of D-D as shown in FIG. 14c.

FIG. 15 is a sectional view showing a method for manufacturing a field effect transistor according to a first embodiment of the invention in steps, based on a line of D-D as shown in FIG. 14c.

Referring to FIG. 15, after forming a sacrifice layer 64, a gate electrode 62 is formed and patterned. Then, the sacrifice layer 24 is again formed and a transparent electrode layer 12 and an opaque electrode layer 14 are then formed. The other steps are the same as described with reference to FIG. 9 except that it is necessary to form a separating space S. FIG. 15 particularly shows that a separating space S is formed under the transparent electrode layer 12 through the etching in the step of S5. The separating space S is not necessarily formed in the step of S5 and can be formed in any one of the steps of S1 to S5.

Figure 16:
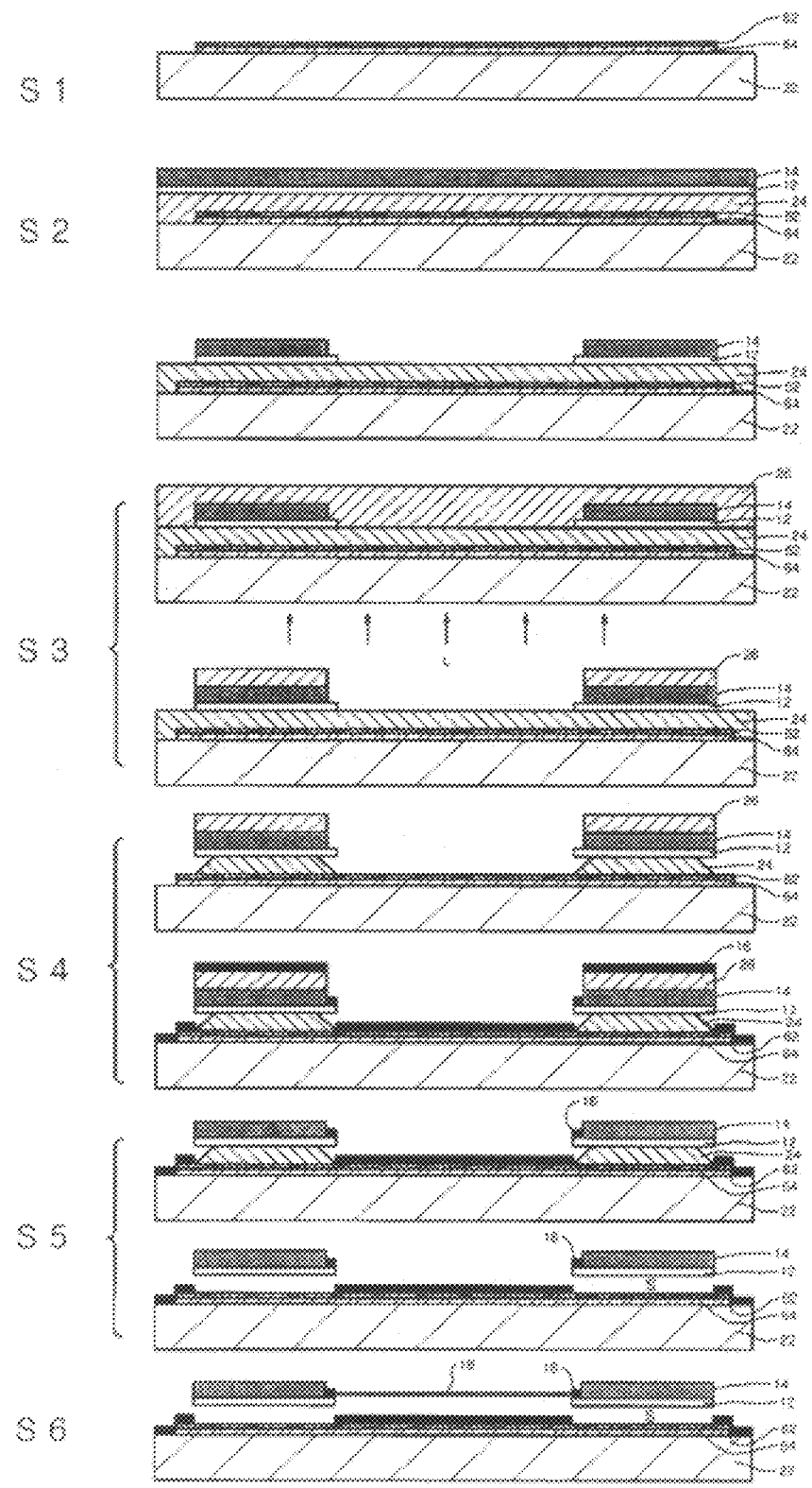
FIG. 16 is a sectional view showing an alternative of a method for manufacturing a field effect transistor according to a first embodiment of the invention.
Figure 17A:
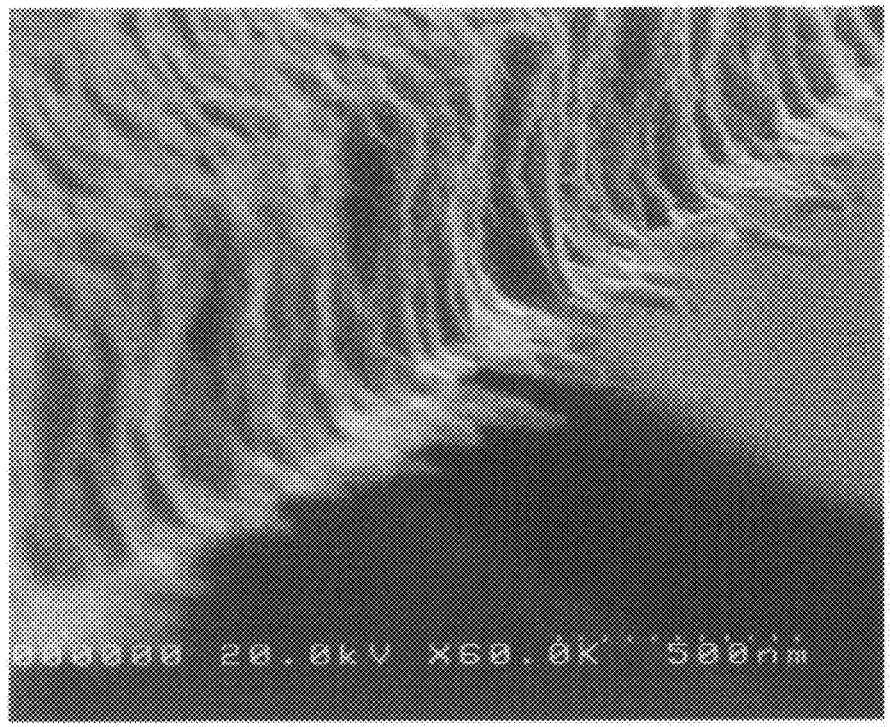
FIG. 17a~17d is a SEM photograph showing a growth of CNT in an electronic device according to a third embodiment of the invention.
Figure 17B:
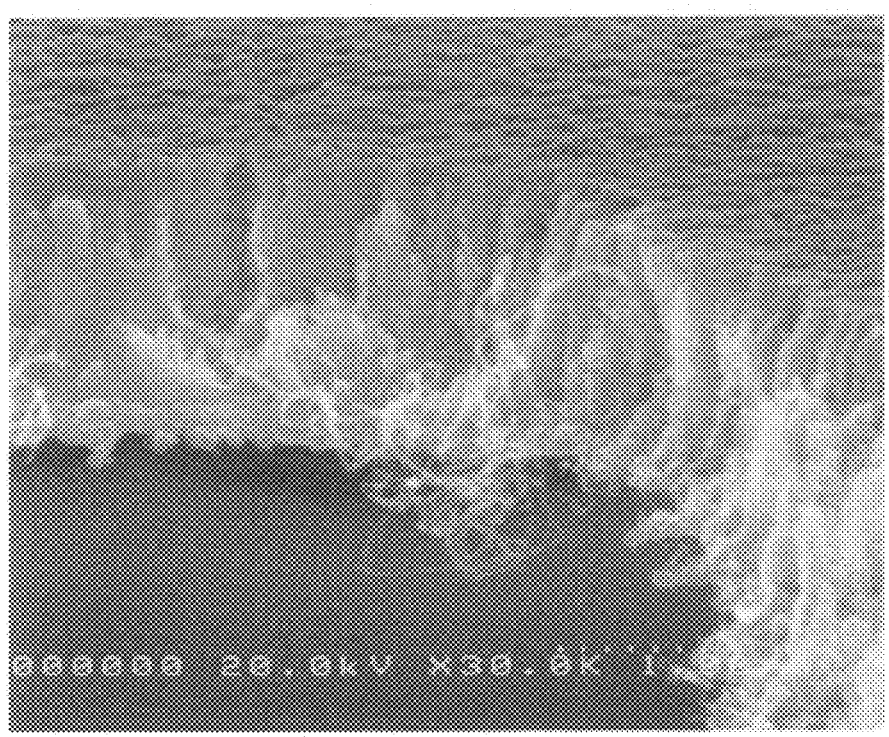
Figure 17C:
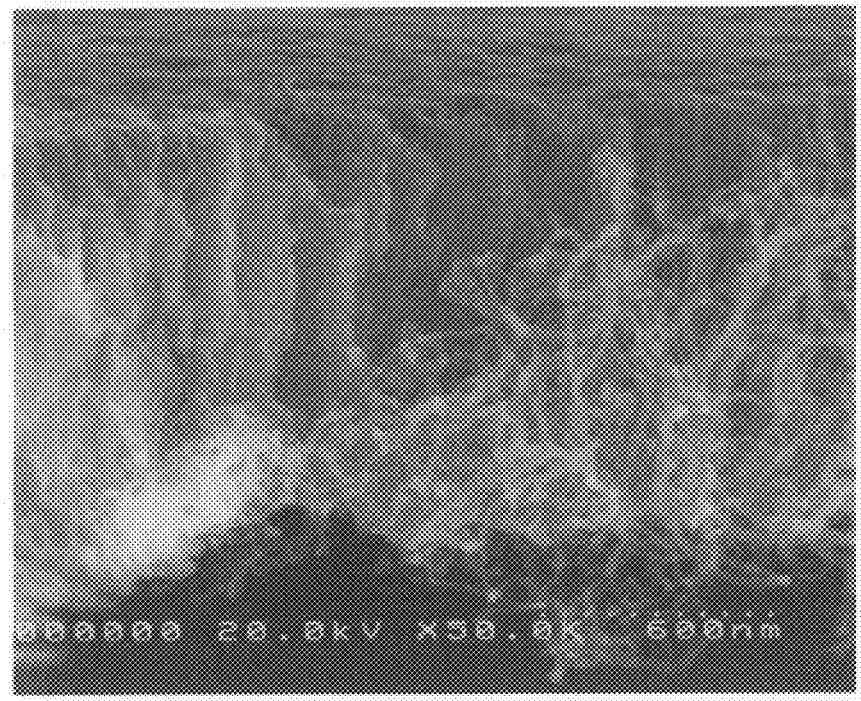
Figure 17D:
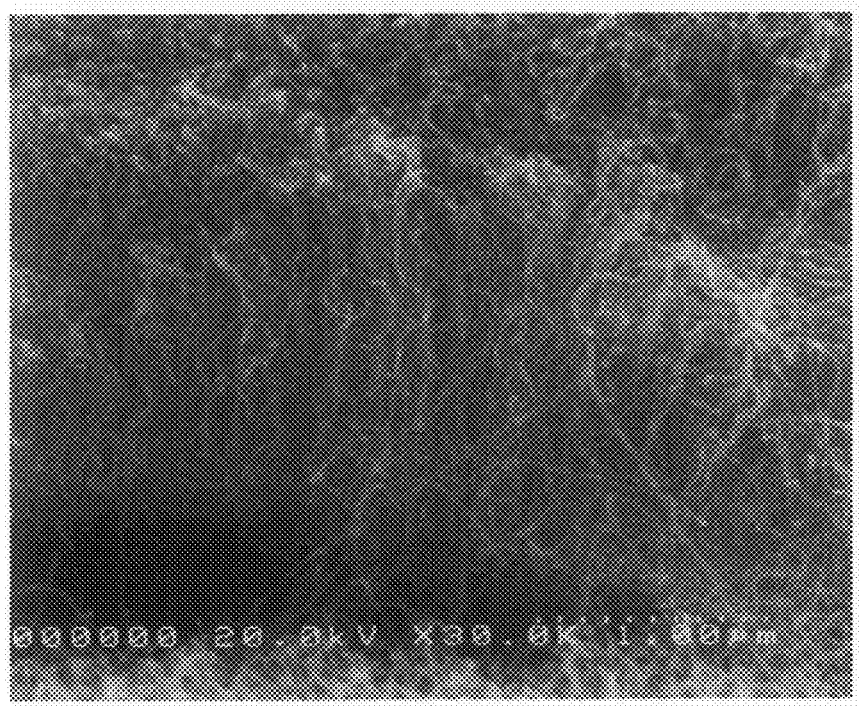

FIG. 16 is a sectional view showing an alternative of a method for manufacturing a field effect transistor according to a first embodiment of the invention.

Referring to FIG. 16, the other steps are the same as those of FIG. 15 except that before forming the catalyst in the step of S4, the sacrifice layer 24 is lifted off in advance and then the catalyst is formed. In the step of S5, only the photoresist layer 26 is lifted off without any lifting off the sacrifice layer 24. As described above, since there is no sacrifice layer 24 to be lifted off in the step of S5, the process can be simplified. Though the catalyst is present on the substrate in some part, there is no worry for CNT being grown from the catalyst in the part because there are no heating elements under the catalyst in the part, from which CNT can grow.

FIG. 17 is a SEM photograph showing a growth of CNT in an electronic device according to a third embodiment of the invention. FIG. 17a shows a structure of the electrode 10 having the catalyst 16 formed on the open surface 15, and FIGS. 17b, 17c and 17d show the growth of CNT from the catalyst after 1 minute, 2 minutes and 10 minutes.

For reference, the transparent electrode layer 12 was Cr of 20 nm and the opaque electrode layer 14 was Mo of 1 μm. Al/Invar was used as the catalyst 16. The deposition for growing CNT was carried under conditions of the room temperature, $C_2H_2$ 200 sccm, Ar 500 sccm and pressure of 8 torr.

As can be seen from FIG. 17, it could be confirmed that a thin single walled CNT was accurately grown from only the desired side part of the electrode. Further, as described above, according to the invention, it is possible to manufacture an electronic device such as transistor having the single walled CNT even at room temperatures.

What is claimed is:

1. An electrode, comprising:
   a transparent electrode layer;
   an opaque electrode layer on the transparent electrode layer, wherein the opaque electrode layer contacts a surface of the transparent electrode layer, the surface of the transparent electrode layer being partially exposed by the opaque electrode layer;
   a catalyst on an open surface of the transparent electrode layer, which open surface is not covered by the opaque electrode layer, and
   at least one horizontally-grown carbon nanotube (CNT) that is grown from the catalyst, the at least one horizontally-grown carbon nanotube (CNT) individually extending substantially parallel to the open surface of the transparent electrode layer.

2. An electronic device, comprising:
a substrate;
a first electrode on the substrate, wherein the first electrode comprises a transparent electrode layer, an opaque electrode layer on the transparent electrode layer and a catalyst on an open surface of the transparent electrode layer, which open surface is not covered by the opaque electrode layer; and
at least one horizontally-grown carbon nanotube (CNT) that is grown from the catalyst, the at least one horizontally-grown carbon nanotube (CNT) individually extending substantially parallel to the open surface of the transparent electrode layer,
wherein the opaque electrode layer contacts a surface of the transparent electrode layer, the surface of the transparent electrode layer being partially exposed by the opaque electrode layer.

3. The electronic device according to claim 2, wherein the transparent electrode layer and the opaque electrode layer are respectively a heating element, and
a separating space is provided under a lower heating element in order to separate the lower heating element from a member below the lower heating element.

4. An electronic device, comprising:
a substrate;
a first electrode on the substrate, wherein the first electrode includes a transparent electrode layer, an opaque electrode layer on the transparent electrode layer and a catalyst on an open surface of the transparent electrode layer, which open surface is not covered by the opaque electrode layer;
a second electrode, the first electrode and the second electrode being parallel to each other on the substrate, wherein the second electrode includes a transparent electrode layer, an opaque electrode layer on the transparent electrode layer and a catalyst on an open surface of the transparent electrode layer, which open surface is not covered by the opaque electrode layer; and
at least one horizontally-grown carbon nanotube (CNT) that is grown from the catalyst of the first electrode or the second electrode, and that is connected to the second electrode or the first electrode, the at least one horizontally-grown carbon nanotube (CNT) individually extending substantially parallel to the open surface of the transparent electrode layer for the first electrode and the second electrode,
the transparent electrode layers and the opaque electrode layers of the first electrode and the second electrode being respectively a heating element, and
a separating space being under a lower heating element in order to separate the lower heating element from a member below the lower heating element.

5. The electronic device according to claim 4, wherein the separating space is formed by etching the substrate.

6. The electronic device according to claim 4, wherein the electronic device further comprises a sacrifice layer between the substrate and the first electrode or the second electrode, and the separating space is formed by etching the sacrifice layer or by etching both the sacrifice layer and the substrate.

7. An electronic device, comprising:
a substrate;
a gate electrode formed on the substrate;
a first electrode on the substrate, wherein the first electrode includes a transparent electrode layer, an opaque electrode layer on the transparent electrode layer and a catalyst on an open surface of the transparent electrode layer, which open surface is not covered by the opaque electrode layer;
a second electrode, the first electrode and the second electrode being parallel to each other while interposing the gate electrode on the substrate, wherein the second electrode includes a transparent electrode layer, an opaque electrode layer formed on the transparent electrode layer and a catalyst formed on an open surface of the transparent electrode layer, which open surface is not covered by the opaque electrode layer; and
at least one horizontally-grown carbon nanotube (CNT) that is grown from the first electrode or the second electrode along an upper part of the gate electrode and is connected to the second electrode or the first electrode, the at least one horizontally-grown carbon nanotube (CNT) individually extending substantially parallel to the open surface of the transparent electrode layer for the first electrode and the second electrode,
the transparent electrode layers and the opaque electrode layers of the first electrode and the second electrode being respectively a heating element, and
a separating space being provided under a lower heating element in order to separate the heating element from a member below the heating element, the electronic device being a field effect transistor.

* * * * *